(12) United States Patent
Utterback et al.

(10) Patent No.: US 6,448,999 B1
(45) Date of Patent: Sep. 10, 2002

(54) METHOD FOR MICROLITHOGRAPHIC WRITING WITH IMPROVED PRECISION

(75) Inventors: Tomas Utterback, Rimbo; Torbjorn Sandstrom, Pixbo; Carl During, Spanga, all of (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 09/461,809

(22) Filed: Dec. 16, 1999

(51) Int. Cl.7 ................................................ B41J 27/00
(52) U.S. Cl. ...................................... 347/259; 347/256
(58) Field of Search .................................. 347/224, 243, 347/259; 250/235, 317.1, 201.8, 559.05, 559.06, 559.3; 219/121.78, 121.68, 121.6, 121.82; 359/286, 575; 355/53, 39; 356/485

(56) References Cited

U.S. PATENT DOCUMENTS

| | | | |
|---|---|---|---|
| 4,213,704 A | * 7/1980 | Burns et al. | 356/485 |
| 4,710,604 A | * 12/1987 | Shirasu et al. | 219/121.78 |
| 4,819,033 A | 4/1989 | Yoshitake et al. | 355/53 |
| 5,006,704 A | * 4/1991 | Mochizuki et al. | 250/235 |
| 5,067,798 A | * 11/1991 | Tomoyasu | 359/286 |
| 5,281,812 A | * 1/1994 | Lee et al. | 250/235 |
| 5,386,319 A | * 1/1995 | Whitney | 359/575 |
| 5,473,409 A | * 12/1995 | Takeda et al. | 355/53 |
| 5,495,280 A | 2/1996 | Gehner et al. | 347/258 |
| 6,057,548 A | * 5/2000 | Schatzberg | 250/317.1 |
| 6,144,011 A | * 11/2000 | Moss et al. | 219/121.68 |

FOREIGN PATENT DOCUMENTS

EP   A20772189   5/1997

* cited by examiner

*Primary Examiner*—Hai Pham
(74) *Attorney, Agent, or Firm*—Birch, Stewart, Kolasch & Birch, LLP

(57) ABSTRACT

The present invention relates to a system and a method for microlithographic writing on photosensitive substrates, and specially printing of patterns with extremely high precision, such as photomasks for semiconductor device patterns, display panels, integrated optical devices and electronic interconnect structures. The system comprises a light source (1), preferably a laser, a computer-controlled light modulator (3) and a lens to contract the at least one light beam from the light source before it reaches the substrate. Further it comprises a device for controlling the position of incidence of the beam on the substrate, a detector for detecting the deviation from the intended position of incidence of the beam on the substrate, and correcting device for controlling the position controlling to device in accordance with the detected deviation diminish position errors at the substrate related to the deviations.

37 Claims, 2 Drawing Sheets

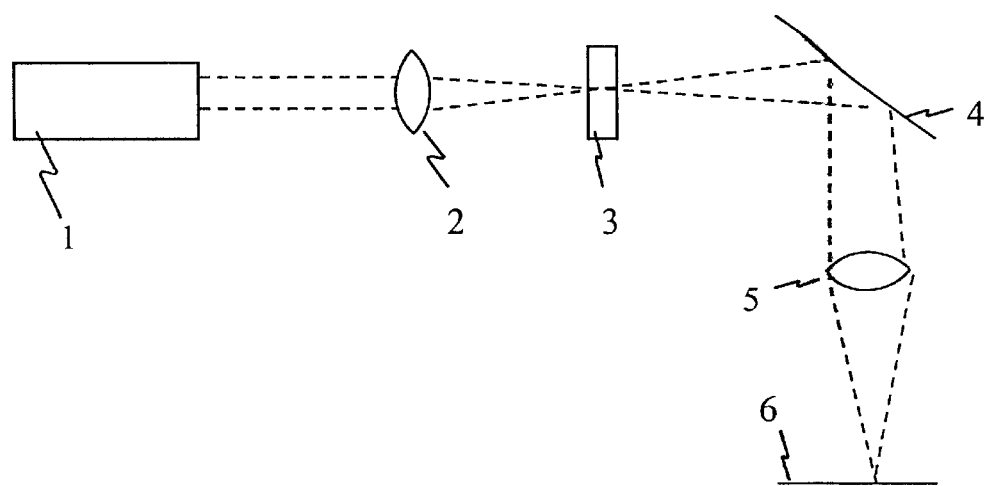
Fig 1 - Prior art
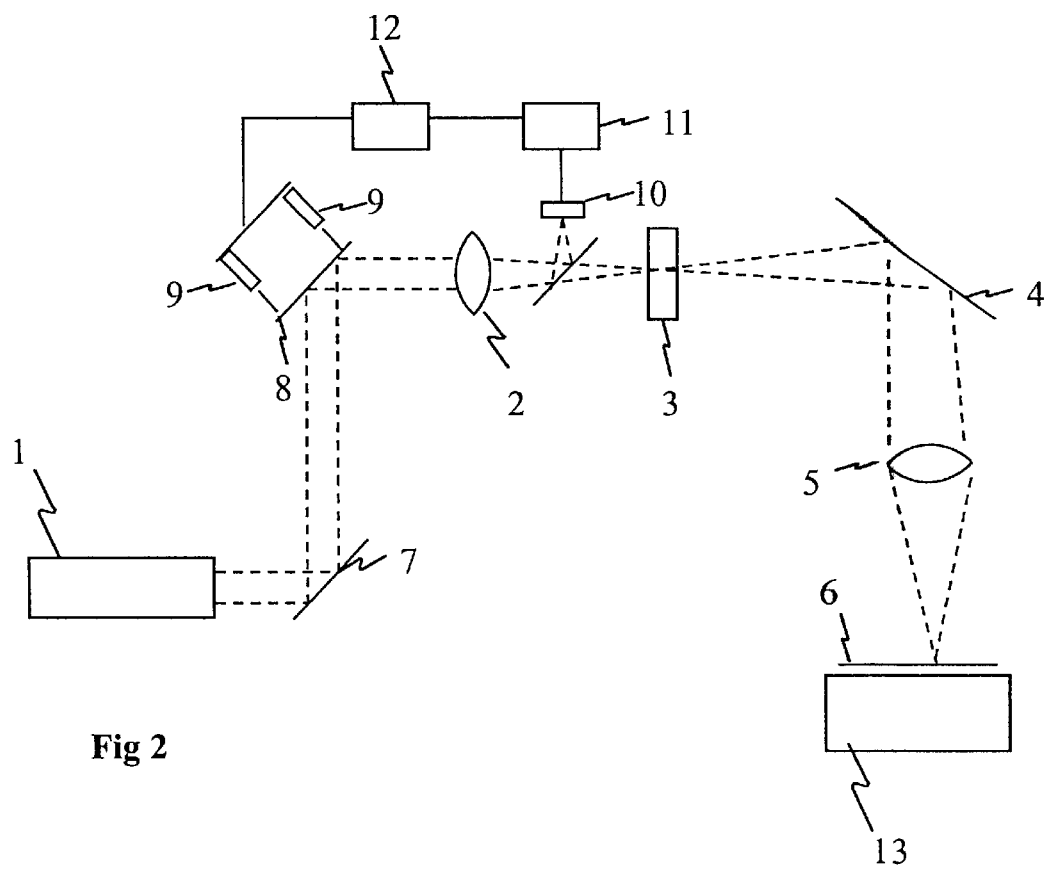
Fig 2

METHOD FOR MICROLITHOGRAPHIC WRITING WITH IMPROVED PRECISION

FIELD OF THE INVENTION

The present invention relates to a system and a method for microlithographic writing on photosensitive substrates, and specially printing of patterns with extremely high precision, such as photomasks for semiconductor device patterns, display panels, integrated optical devices and electronic interconnect structures. The terms writing and printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared to extreme UV.

BACKGROUND OF THE INVENTION

A system and method for microlithographic writing of a substrate is previously known from e.g. EP 0 467 076 by the same applicant. An example of a system for microlithographic writing, as is shown in FIG. 1, comprises a light source 1, such as a laser, a first lens 2 to contract the light beams, a modulator 3 to produce the desired pattern to be written, the modulator being controlled according to input data, a reflecting mirror 4 to direct the beams towards the substrate 6, and a lens 5 to contract the beams before they reach the substrate. The mirror 4 can be used for a scanning operation to scan the beam over scan lines at the substrate. Several functionally equivalent scanners such as acusto-optic deflectors etc. could also be used. Further, the substrate is preferably arranged on a object table. Two-dimensional relative motion between the lens 5 and the table (stage) is provided and controlled by servo systems. For example the object table could be movable in at least two orthogonal directions, by means of two electrical servo motors.

However, a problem with such known writing systems are that the emission direction of the laser is not constant, but suffers from significant direction variations. Further, vibrations from the water cooling system of the laser are transmitted into the laser, and affects the emitted light beam. The laser beam may also be affected by turbulence and the like in the air, which is particularly likely to occur when the laser becomes warm. As a result there is a deviation between the actual laser light direction and the intended direction, and consequently the precision in the writing on the substrate is decreased.

SUMMARY OF THE INVENTION

It is therefore an object of the present invention to provide a system in which the above mentioned problems with the prior art is solved.

This object is achieved with a system according to the appended claims.

According to the invention a system for microlithographic writing of high precision patterns on a photosensitive substrate (6) is provided, the system comprising a light source (1), preferably a laser, a computercontrolled light modulator (3) and a lens to contract the light beam from the light source before it reaches the substrate. Further, it comprises means for controlling the position of incidence of the beam on the substrate, a detector for detecting the deviation from the intended position of incidence of the beam on the substrate, and correcting means for controlling the position controlling means in accordance with the detected deviation to diminish position errors at the substrate related to said deviations. Preferably the detector detect deviations from the intended position of the beam before it reaches the modulator.

According to this system there is at least a compensation for deviations in the light beam that are generated ahead of the modulator. Since most deviations are generated in the laser or close to the same, most such deviation errors are hereby taken care of.

Further, according to the invention the detector detects deviations from the intended position of incidence of the beam on the substrate. This could either be done by a direct measurement or by measuring in a plane being optically equivalent with the image area on the substrate.

In a preferred embodiment the position controlling means comprises small servos attached to a reflecting mirror, reflecting the light beam before it reaches the substrate, to control the position of the same, and preferably before it reaches the modulator. Hereby the correction of the beam is made before the light reaches the modulator, and hence the image that is written on the substrate is essentially an exact reproduction of the image generated in the modulator.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For exemplifying purposes, the invention will be described in closer detail in the following with reference to embodiments thereof illustrated in the attached drawings, wherein:

FIG. 1 is a schematic illustration of a system according to the prior art;

FIG. 2 is a schematic illustration of a system according to a preferred first embodiment of the invention.

DESCRIPTION OF THE PREFERRED EMBODIMENTS

Figure 3:
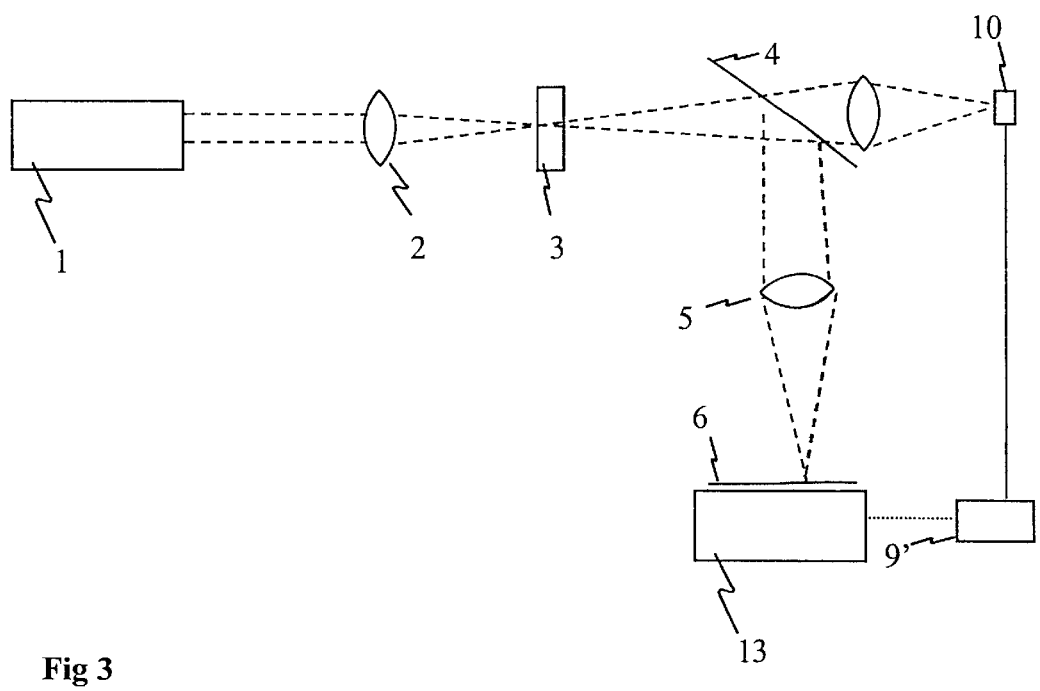
FIG. 3 is a schematic illustration of a second embodiment of a system according to the invention.

Referring to FIG. 2, the system according to the preferred embodiment of the invention comprises a light source 1, preferably a laser, a computer-controlled light modulator 3 and a lens 5 to contract the light beam from the light source before it reaches the photosensitive substrate 6. Further it comprises a second contracting lens 2 ahead of the modulator.

The system also comprises a detector device 10 for detecting deviations from the intended position of the beam before it reaches the modulator. In this embodiment the detector device comprises a detector positioned away from the beam path, and a semi-transparent mirror or the like to direct the beam towards the detector. The detector is preferably positioned in the reflected beam focus. Further, the detector is preferably divided in different fields situated around the expected beam center, whereby deviations from the expected position easily can be detected. Hereby the detector is able to detect position deviations in all directions simultaneously. However, other types of detectors are possible to use in the system according to the invention. The semi-transparent mirror is preferably positioned close to the modulator, whereby the light hitting the detector is correlated with the light hitting the modulator.

The signal from the detector is fed to correcting means for controlling means for controlling the position of incidence of the beam on the substrate in accordance with the detected deviation. Hereby position errors at the substrate as a result of said deviations are diminished.

According to a preferred embodiment the position controlling means comprises small servos 9 attached to a reflecting mirror 8, reflecting the light beam before it reaches the substrate. Hereby the light beam be corrected in all directions before it reaches the modulator. The servos 9 are preferably piezoelectric actuators. The reflecting mirror is in the preferred embodiment positioned ahead of the detector. However, it also possible to place the reflecting mirror after the modulator, and after the detector. The system will hereby become a feed-forward system instead of a feed-back system. Any method of moving the image on the substrate could be used in a feed-forward configuration, such as time delays of scan lines and modulated signals, fine movement of the final lens or movement of the stage (object table).

The signal from the detector is preferably first forwarded to an amplifier 11, to amplify the signal, and thereafter to a filter 12, before it is feed to correcting means for controlling the position controlling means. The filter is used to filter out high frequency signals to reduce noise and tune the dynamic properties of the system.

The distance between the mirror 8 and the lens is, in one preferred embodiment, essentially the same as the distance between the lens and the modulator, and preferably the focal distance of the lens. Hereby only small compensation angles are needed to correct the direction of the beam.

The position controlling with the moveable mirror 8, is a very fast system, while the mass that has to moved is small, and so is the needed moving distance. Hence, this system could be made very fast. Alternatively the position controlling means comprises servos for controlling the position of the object table supporting the substrate relative to the light beam. These controlling means could then be the conventional, already existing servos for moving the object table.

The system is preferably a laser scanner system, such as is known from EP 0 467 076, but with enhanced precision according to the invention, and the modulator is preferably an acousto-optic modulator. However, the invention could also be used in a non-scanning system where the modulator comprises a plurality of modulating elements, and preferably a spatial light modulator. In this case the mirror 4 in FIG 2 is optional.

The invention could also be used in multi-beam systems, where the system comprises a beam splitter to divide the beam from the light source to several beams, exposing the substrate in several scan lines simultaneously. In such a system, one of the beams could be used for detection, and be directed to the detector. The position errors of the other beams, at least the errors caused ahead of the beam splitter, will be identical, and hence it will be possible to control the position of the writing beam/beams accordingly.

In FIG. 3, an alternative embodiment of the invention according to the invention is shown. In this embodiment the scanning mirror 4 is semi-transparent, and the beam that is transmitted through the mirror is contracted by a detector lens, and directed towards the detector 10. In this embodiment the detector signal is forwarded to a position trolling means 9 controlling the position of the table 13. However, the previously described position controlling means, in the first embodiment, could naturally be used.

The system according to the invention provides enhanced precision in an easy way and by means of few components. The system compensates for essentially all beam position variations, up to the position of the detector, and with use of the same detector for compensation in all directions.

According to the invention, the detector measures the deviation in a plane that is optically equivalent with the image area on the substrate. In FIG. 3, planes in the modulator 3 and the detector 10 are optically equivalent with the image area on the substrate 6, whereas e.g. planes in the lenses 2 and 5 are not optically equivalent.

Thus, the invention makes microlithographic writing of high precision patterns more efficient and cost effective, at the same time as the pattern precision is improved. However several variations of the above-mentioned embodiments are possible, and obvious for a person skilled in the art. Such obvious modifications must be considered as being part of the invention, as it is defined by the following claims.

What is claimed is:

1. A system for microlithographic writing of high precision patterns on a photosensitive substrate comprising:
   a light source;
   a computer-controlled light modulator;
   a substrate table;
   a lens to contract at least one light beam from the light source before the at least one light beam reaches the substrate on the substrate table;
   a detector for detecting a deviation from an intended position of incidence of the beam on the substrate; and
   a mirror reflecting the light beam before the light beam reaches the substrate for controlling the position of incidence of the beam on the substrate and correcting the position thereof in accordance with the deviation to diminish position errors at the substrate related to the deviation, wherein the mirror is arranged before the light modulator.

2. The system according to claim 1, wherein the system further comprises a beam splitter for dividing the beam in at least two equivalent beams, whereby one beam from the beam splitter is used to detect the position deviation.

3. The system according to claim 1, wherein the mirror is controlled by servos attached to the mirror.

4. The system according to claim 3, wherein the servos comprise, piezoelectric actuators.

5. The system according to claim 3, wherein the reflecting mirror is positioned ahead of the detector.

6. The system according to claim 1, wherein the substrate table is movable relative to the light beam.

7. The system according to claim 1, wherein the system is a laser scanner system.

8. The system according to claim 1, wherein the modulator is an acousto-optic modulator.

9. The system according to claim 1, wherein the modulator is a plurality of modulating elements.

10. The system according to claim 9, wherein the plurality of modulating elements comprises a spatial light modulator.

11. The system according to claim 1, wherein the system comprises only one detector.

12. The system of claim 1, wherein the mirror is adapted to control the position of incidence of the beam on the substrate in two dimensions.

13. A method for microlithographic writing of high precision patterns on a photosensitive substrate comprising the steps of:

modulating at least one light beam from a light source with a computer-controlled modulator;

contracting the at least one light beam by a lens before the light beam reaches the substrate;

detecting a deviation from an intended position of incidence of the light beam on the substrate, wherein the deviation is detected with a detector positioned close to the modulator so that the light beam position on the detector is correlated with the light beam position on the modulator;

controlling the position of incidence of the beam on the substrate; and correcting the position of incidence of the beam on the substrate in accordance with the deviation to diminish position errors at the substrate related to the deviation, wherein said step of correcting is performed before said modulating step.

14. The system according to claim 13, wherein the step of detecting a deviation is performed with a detector having a fixed geometrical relation relative to the light spot from the beam on the substrate.

15. The method of claim 13, further comprising dividing the light beam into at least two equivalent light beams, whereby one light beam from a beam splitter is used to detect the position deviation.

16. The method of claim 13, wherein said correcting step is performed with a movable mirror.

17. The method of claim 13, wherein a substrate-table is moveable relative to the light beam.

18. The method of claim 13, wherein said method is used in a laser scanner system.

19. A system for microlithographic writing of high precision patterns on a photosensitive substrate comprising:

a light source;

a computer-controlled light modulator;

a substrate table;

a lens to contract at least one light beam from the light source before the light source reaches the substrate;

a detector for detecting a deviation from an intended position of incidence of the light beam on the substrate, wherein the detector is positioned close to the modulator so that the light beam position on the detector is correlated with the light beam position on the modulator; and means for controlling the position of incidence of the beam on the substrate for correcting the position thereof in accordance with the deviation to diminish position errors at the substrate related to the deviation, wherein said means is positioned before the modulator.

20. The system of claim 19, wherein the light beam intercepted by the detector has a fixed geometrical relation relative to a spot from the light beam on the substrate.

21. The system of claim 19, wherein the system further comprises a beam splitter for dividing the light beam in at least two equivalent light beams, whereby one light beam from the beam splitter is used to detect the position deviation.

22. The system of claim 19, wherein said controlling means comprises a movable mirror.

23. The system of claim 22, wherein the mirror is controlled by servos attached to the mirror.

24. The system of claim 19, wherein the substrate table is movable relative to the light beam.

25. The system of claim 19, wherein the system is a laser scanner system.

26. The system of claim 19, wherein the modulator is an acousto-optic modulator.

27. The system of claim 19, wherein the modulator is a plurality of modulating elements.

28. A system for microlithographic writing of high precision patterns on a photosensitive substrate comprising:

a light source;

a computer-controlled light modulator;

a substrate table which is movable in at least one direction;

a lens to contract at least one light beam from the light source reaches the substrate;

a detector for detecting a deviation from an intended position of incidence of the light beam on the substrate, wherein the detector is positioned close to the modulator so that the light beam position on the detector is correlated with the light beam position on the modulator; and means for controlling the position of the substrate table in order to control the incidence of the beam on the substrate and for correcting the position thereof in accordance with the deviation to diminish position errors at the substrate related to the deviation.

29. The system of claim 28, wherein the light beam intercepted by the detector has a fixed geometrical relation relative to a spot from the light beam on the substrate.

30. The system of claim 28, wherein the system further comprises a beam splitter for dividing the light beam in at least two equivalent light beams, whereby one light beam from the beam splitter is used to detect the position deviation.

31. The system of claim 28, wherein the system is a laser scanner system.

32. The system of claim 28, wherein the modulator is an acousto-optic modulator.

33. The system of claim 28, wherein the modulator is a plurality of modulating elements.

34. A method for microlithographic writing of high precision patterns on a photosensitive substrate comprising the steps of:

modulating at least one light beam from a light source with a computer-controlled modulator;

providing a substrate table being movable in at least one direction;

contracting the at least one light beam from the light source by a lens before the light source reaches the substrate on the substrate-table;

detecting a deviation from an intended position of incidence of the at east one light beam on the substrate, wherein the detector is positioned close to the modulator so that the light beam position on the detector is correlated with the light beam position on the modulator;

adjusting the position of incidence of the at least one light beam on the substrate in accordance with the deviation to diminish position errors at the substrate related to the deviation by moving the substrate table.

35. The method of claim 34, further comprising dividing the light beam into at least two equivalent light beams, whereby one light beam from the beam splitter is used to detect the position deviation.

36. The method of claim 34, wherein said method is used in a laser scanner system.

37. A system for microlithographic writing of high precision patterns on a photosensitive substrate comprising:

a light source;

a computer-controlled light modulator;

a substrate table;

a lens to contract at least one light beam from the light source before the at least one light beam reaches the substrate on the substrate table;

a detector for detecting a deviation from an intended position of incidence of the beam on the substrate, the detector is positioned close to the modulator so that the light beam positioned on the detector is correlated with the light beam positioned on the modulator, wherein the light beam intercepted by the detector has a fixed geometrical relation relative to the light spot from a beam on the substrate; and a mirror reflecting the light beam before the light beam reaches the substrate for controlling the position of incidence of the beam on the substrate and correcting the position thereof in accordance with the deviation to diminish position errors at the substrate in relation to the deviation.

* * * * *

UNITED STATES PATENT AND TRADEMARK OFFICE
CERTIFICATE OF CORRECTION

PATENT NO.   : 6,448,999 B1                                              Page 1 of 1
DATED        : September 10, 2002
INVENTOR(S)  : Tomas Utterback et al.

It is certified that error appears in the above-identified patent and that said Letters Patent is hereby corrected as shown below:

<u>Title page,</u>
Please insert item [30] Foreign Application Priority Data, as follows:

-- [30]      Foreign Application Priority Data

Dec. 16, 1998   (SE)  Sweden ........................ 9804344-1 --.

Signed and Sealed this

Twenty-seventh Day of May, 2003

JAMES E. ROGAN
*Director of the United States Patent and Trademark Office*